United States Patent [19]
Murphy et al.

[11] 3,962,692
[45] June 8, 1976

[54] SOLID STATE TEMPERATURE RESPONSIVE SWITCH

[75] Inventors: Michael P. Murphy, Flint; John W. Riddel, Fenton, both of Mich.

[73] Assignee: General Motors Corporation, Detroit, Mich.

[22] Filed: Nov. 18, 1974

[21] Appl. No.: 524,675

[52] U.S. Cl. .................. 340/228 R; 73/362 SC; 357/28; 357/63; 357/64
[51] Int. Cl.² .................. G01K 7/22; G08B 21/00; H01L 29/167; H01L 31/10
[58] Field of Search ............. 73/362 SC; 357/28, 63, 357/64; 338/22 SD, 25; 340/228 R

[56] References Cited
UNITED STATES PATENTS

| | | | |
|---|---|---|---|
| 2,871,330 | 1/1959 | Collins | 357/64 |
| 2,871,427 | 1/1959 | Tyler et al. | 357/64 |
| 3,248,677 | 4/1966 | Hunter | 357/28 |
| 3,443,167 | 5/1969 | Willardson et al. | 357/28 |
| 3,484,658 | 12/1969 | Komatsu | 357/28 |
| 3,491,325 | 1/1970 | Hu | 357/28 |
| 3,548,269 | 12/1970 | MacDougall et al. | 357/28 |
| 3,719,797 | 3/1973 | Andrews, Jr. et al. | 357/28 |
| 3,745,429 | 7/1973 | Fujishiro | 357/64 |
| 3,812,717 | 5/1974 | Miller et al. | 357/28 |

*Primary Examiner*—William D. Larkins
*Attorney, Agent, or Firm*—Robert J. Wallace

[57] ABSTRACT

A silicon solid state temperature responsive switching device having a thermally dependent P-N junction. The thermally dependent P-N junction is at the interface of a thermally invertible region and a non-invertible region. The thermally invertible region is doped with both P-type and N-type impurities. The P-type impurities have a concentration which is at least about 10 times the concentration of the N-type impurities. The P-type impurities also have an activation energy which is at least about three times the activation energy of the N-type impurities. Below a predetermined temperature, the doping effect of the N-type impurities predominates, and the invertible region is N-type. However, above the predetermined temperature, the doping effect of the P-type impurities predominates. A device insensitive to voltage source polarity is formed by sandwiching the thermally invertible region between two non-invertible regions.

4 Claims, 4 Drawing Figures

SOLID STATE TEMPERATURE RESPONSIVE SWITCH

BACKGROUND OF THE INVENTION

This invention relates to a semiconductor device. More particularly, it relates to a silicon solid state temperature responsive switch.

There are many applications for a device that will conduct or block electrical current flow up to a predetermined temperature and will switch over to the opposite state above that temperature. Temperature sensitive devices of a variety of types have been used in the past for thermally responsive electrical switches. Among these devices are thermocouples, bi-metal thermal expansion switches, thermistors, and the like. Each of these devices have unique characteristics that make them quite suitable for selected applications. We have found a new solid state temperature responsive switch that is suitable for a variety of applications. For example, it can be directly incorporated in a monolithic circuit, as well as be made as a discrete electrical component. Our device can be made and the switching temperature set with the usual type of techniques employed in making semiconductor devices, including integrated circuits. As a result, numerous advantages are inherently possible including better circuit compatibility, lower cost, smaller size circuits, etc. Moreover, our solid state device can be made so that it is insensitive to polarity of a constant voltage source applied, and is useful with alternating current as well as direct current sources.

OBJECTS AND SUMMARY OF THE INVENTION

It is, therefore, an object of this invention to provide a new solid state temperature sensitive switch.

A further object of the invention is to provide a silicon solid state temperature sensitive switch that can be incorporated in a monolithic integrated circuit.

A still further object of this invention is to provide a silicon solid state temperature sensitive switch that is insensitive to polarity of an applied voltage source and that is useful with an alternating current as well as direct current source.

In brief, the present invention involves a silicon semiconductor device having at least one thermally dependent P-N junction. The junction is formed with a region that thermally inverts from N-type conductivity to P-type conductivity at a predetermined temperature. The region contains selected conductivity determining impurities of both conductivity types, in selected concentrations. The P-type impurities are at least ten times more concentrated than the N-type impurities and have an activation energy of at least three times greater. This region is contiguous to at least one region, of non-invertible or unchangeable conductivity type. A P-N junction appears between the two regions only when they are of opposite conductivity type. A particularly significant device has the changeable region sandwiched between two unchangeable regions, making it useful with alternating current or direct current voltage sources regardless of polarity.

BRIEF DESCRIPTION OF THE DRAWINGS

Other objects, features and advantages of this invention will become apparent from the following description of preferred embodiments and from the drawing in which.

DESCRIPTION OF THE PREFERRED EMBODIMENT

Figure 1:
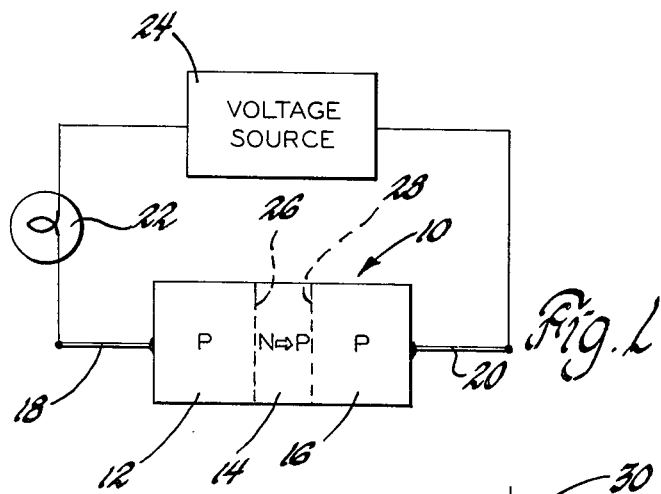
FIG. 1 shows a schematic view of an electrical circuit containing one embodiment of this invention.

FIG. 1 shows a schematic view of an electrical circuit containing a particularly significant switch 10 made in accordance with the present invention. Switch 10 is a body of high purity monocrystalline silicon having two outer regions 12 and 16 that are separated by an inner region 14 about 0.001 inch wide. Two terminals 18 and 20 make low resistance electrical connections to regions 12 and 16, respectively. Terminals 18 and 20 provide electrical access to switch 10. As an illustrative example of one application for the device of the present invention, switch 10 is series connected to a warning light or load 22 and a constant voltage source 24. Voltage source 24 can supply direct current of either polarity or supply alternating current.

This invention recognizes that an impurity atom is not an effective dopant in a semiconductive material until the impurity atom is activated. In a very simplified view, an N-type impurity atom is activated by elevating one of its valance electrons into the semiconductor conduction band. A P-type impurity atom is activated by elevating a semiconductor valance band electron to a vacancy in the impurity atom valance band, forming a hole in the semiconductor valance band. Thus, by activation energy, we mean the energy needed to release an electron or hole from an impurity atom. The conduction band electrons and valance band holes so produced are free to move about within their respective bands and, participate in electrical conduction. The more such free electrons or hols are generated, the more N-type or P-type the semiconductive material becomes.

The activation energy of an impurity atom can be supplied thermally. Thus, at higher temperatures, a greater proportion of impurity atoms present will be activated, and their electrons or holes released, than at lower temperatures. We have noted that activation energy differs from one impurity to another. We further have recognized that equal concentrations of different impurities will have a different degree of activation at a given temperature, and that this produces a different effective doping. Analogously, we have appreciated that by varying the temperature, we can vary the effective doping of an impurity atom.

We contemplate including both selected P-type and N-type impurities within the same region of a semiconductive material in selected concentrations. This region has excess free electrons at lower temperatures and excess free holes at higher temperatures. Thus, at lower temperatures the region is effectively doped N-type, and at higher temperatures it is effectively doped P-type. The transistion temperature, the temperature at which it switches from N-type to P-type is predetermined by the impurities selected and the relative concentrations that are used.

Contiguous opposite conductivity type regions of a semiconductive body, of course, produce a P-N junction and contiguous similar conductivity type regions do not form such a P-N junction. In our device, the aforementioned thermally invertible region is a contiguous region that does not thermally invert. If the non-inverting contiguous region is P-type, a P-N junction will only appear below the predetermined temperature. By varying the temperature, a P-N junction will appear or disappear at the predetermined temperature. This effect is reversible, and can be used to block or permit current flow which can be selectively employed to do useful work, depending upon temperature. If the thermally inverting region is sandwiched between two non-inverting regions, two such thermally dependent P-N junctions are produced. This sandwich device can be used to switch direct current of either polarity and alternating current.

If the preferred embodiment shown in FIG. 1, silicon body region 12 and 16 are doped only with boron atoms to an actual concentration of about $1.0 \times 10^{19}$ atoms per cubic centimeter. The activation energy of the boron atom is about 0.045 electron volts. The boron impurities provide an excess of free holes in regions 12 and 16, therefore, these regions are labeled P, as is commonplace in semiconductor nomenclature.

In contrast, inner regions 14 has both P-type and N-type conductivity determining impurities therein. Region 14 contains both indium and arsenic atoms for doping. The indium atoms have an activation energy of 0.16 electron volts and an actual concentration of about $1.03 \times 10^{19}$ atoms per cubic centimeter. The arsenic atoms have an activation energy of 0.045 electron volts and an actual concentration of about $1.0 \times 10^{18}$ atoms per cubic centimeter. The indium atoms serve as P-type or acceptor impurities for region 14. In contrast, the arsenic atoms serve as N-type or donor impurities for region 14. Thus, the actual concentration of indium atoms is about ten times greater than the actual concentration of arsenic atoms. However, their effective concentrations as dopants are different, and these effective concentrations vary with temperature. As previously pointed out, they are not effective as dopants unless activated, and they are activated to different degrees at any given temperature.

Figure 2:
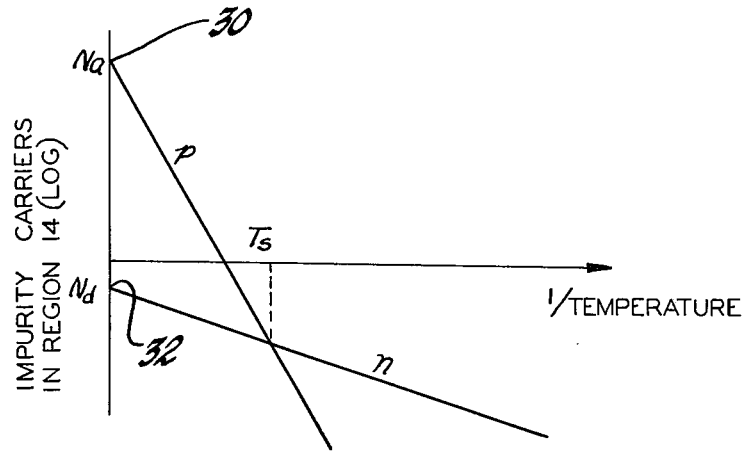
FIG. 2 shows a graph illustrating the change in impurity concentration in the middle region of the device shown in FIG. 1, as a function of temperature.

FIG. 2 graphically shows the effective doping concentrations of the indium and arsenic atoms in region 14 as they change with respect to temperature. As can be seen, at lower temperatures below $T_s$ (switching temperature), there are more activated arsenic atoms (free electrons) than activated indium atoms (free holes). Therefore, at temperatures below $T_s$, region 14 exhibits N-type conductivity characteristics. Consequently, switch 10 will have a P-N junction 26 and a P-N junction 28 between region 14 and each of regions 12 and 16, respectively. One of these junctions will always be reverse biased by an applied electrical potential. Voltage source 24 is negative with respect to terminal 20. Consequently, junction 28 will be reverse biased. However, if the voltage source is reversed and terminal 18 made negative, junction 26 will be reverse biased. Accordingly, regardless as to the polarity of voltage source 24, switch 10 will not conduct current below temperature $T_s$. Switch 10 would have current vs. voltage characteristics as shown by the curve in FIG. 3 labeled $T<T_s$, with $V_b$ representing breakdown voltage.

Figure 3:
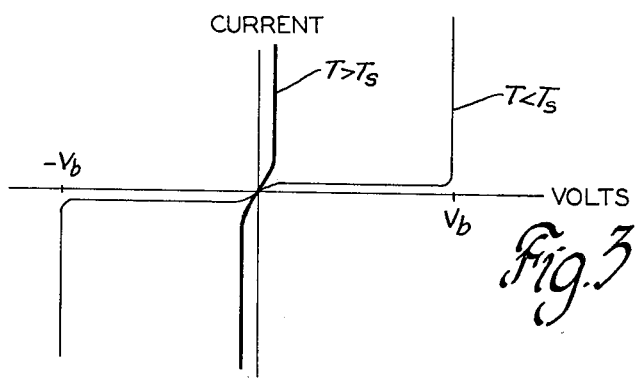
FIG. 3 shows a graph of the type of current vs. voltage characteristics to be expected for this invention.

We shall now discuss the operation of switch 10 at temperatures above $T_s$. Referring again to FIG. 2, it can be seen that above $T_s$ the free holes from the actual indium atoms exceed the free electrons from the activated arsenic atoms. Hence, region 14 effectively changes to from N-type doping to P-type doping. The P-N junctions 26 and 28 accordingly disappear and switch 10 permits current flow in either direction. Therefore, the current which passes through the load 22 is increased resulting in a proportional increase in voltage thereacross which may be used to activate an alarm or warning devoce, such as a light. The curve labeled $T>T_s$ of FIG. 3 shows the resulting current vs. voltage characteristics expected of switch 10 at temperatures above $T_s$.

Figure 4:
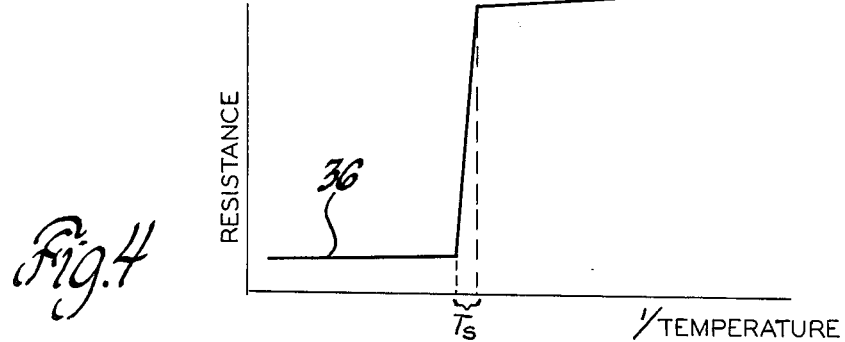
FIG. 4 shows a graph illustrating the resistance change with temperature to be expected with a device of this invention.

The precise molecular interaction of switch 10 has not been completely explained. However, we have postulated a general theory of operation. Referring still again to FIG. 2, at a relatively high temperature of about 1000°C. or above, substantially all of the P-type and N-type impurity atoms present in region 14 are activated into their conducting mode. At this point their effective concentration substantially equals their actual concentration. This is represented by points 30 and 32, respectively, on the graph of FIG. 2. It will be recalled that the P-type impurity atoms have an actual concentration much higher than the actual concentration of N-type impurity atoms. However, the P-type impurity also has a higher activation energy than the N-type impurity. Therefore, at lower temperatures more N-type impurity atoms will be activated per degree centigrade than P-type impurity atoms. However, there are actually more P-type impurity atoms in region 14 than N-type impurity atoms. Consequently, at higher temperatures a greater number of P-type impurity atoms will be activated than N-type. The resistance vs. temperature characteristics expected for such a switch is shown in FIG. 4. A very large ratio between maximum and minimum resistance is to be expected. In the example, described herein this ratio should be about 830:1. Portion 34 of the graph of FIG. 4 represents the resistance of switch 10 when region 14 is predominantly, N-type. In contrast, portion 36 represents the resistance of switch 10 when region 14 is predominantly P-type. Calculations show the resistance of switch 10 to change drastically over a very narrow temperature range represented by $T_s$. This narrow temperature range $T_s$ is a function of the large difference between the activation energy of the P-type impurities and the N-type impurities. That is, the larger the activation energy differential, the more abrupt the change in conductivity type at $T_s$.

It is a feature of this invention that the temperature at which switch 10 switches from a conducting to a non-conducting mode, $T_s$, can be determined by the choice and concentration of the P-type and N-type impurities. At $T_s$ the number of activated donor atoms equals the number of activated donor atoms. This is also represented by the equation:

$$n = p$$

where $n$ equals free electron concentration in the silicon conduction band and $p$ equals free hole concentration in the silicon valence band, then $$n = N_d \exp^{-E_d/kT_s}$$

$p = N_a \exp^{-E_a/kT_s}$ where $N_d$ = actual concentration of donor impurities per cc
$E_d$ = activation energy of donor impurities
$N_a$ = concentration of acceptor impurities per cc
$E_a$ = activation energy of acceptor impurities per cc
$k$ = Boltzman's constant
$T_s$ = desired switching temperature Therefore, solving for $T_s$:

$N_d \exp^{-E_d/kT_s} = N_a \exp^{-E_a/kT_s}$
$N_d/N_a = \exp^{(E_d - E_a)/kT_s}$
$\ln N_d/N_a = E_d - E_a/kT_s$
$T_s = E_d - E_a/k \ln (N_d/N_a)$ Therefore, the temperature at which switch 10 switches from a nonconducting to conducting mode can be readily varied by varying the relative concentrations of the impurities. In the preferred embodiment $T_s$ is approximately 277° C.

It should be noted that other P-type conductivity determining impurities may be used in region 14 as a substitute for or in addition to indium. Analogously, other N-type conductivity determining impurities may be used in region 14 as a substitute for or in addition to arsenic. However, the N-type impurities should have an activation energy of less than 0.1 electron volt and the P-type impurities should have an activation energy at least three times the activation energy of the N-type impurities. Furthermore, the total concentration of all the P-type impurities in region 14 should be at least ten times the total concentration of all the N-type impurities.

Copper and phosphorus can be used in region 14 instead of indium and arsenic, respectively. Copper has an activation energy of 0.24 electron volts and phosphorus has an activation energy of 0.045 electron volts. Used in respective concentrations of $5.7 \times 10^{19}$ atoms per cubic centimeter and $9.1 \times 10^{17}$ atoms per cubic centimeter they also provide a $T_s$ of 277° C. N. B. Hannay's book *Semiconductors*, Reinhold Publishing Corporation, 1959, on page 342 shows the activation energies of other conductivity determining impurities which may be used. The specific concentrations to be used for conductivity determining impurities in region 14 will depend on their activation energies and the switching temperature $T_s$ that is desired. However, for most purposes, it is believed that each impurity in region 14 should be used in concentration of about $1 \times 10^{15}$ to $1 \times 10^{20}$ atoms per cubic centimeter. The conductivity determining impurities used in regions 12 and 16 should also be used in this concentration range. As previously mentioned, the conductivity type of the outer regions 12 and 16 may be N-type instead of P-type. In such case, P-N junction 26 and 28 will not appear at temperatures below $T_s$ but will appear, and block current flow at temperatures above $T_s$. Therefore, although this invention has been described in connection with specific embodiments thereof, no limitation is intended thereby except as defined in the appended claims.

We claim:

1. An electrical circuit that includes a solid state temperature responsive switch device having a thermally dependent P-N junction providing switching action, said circuit comprising:
   a body of semiconductive material, said body having at least two regions defining an interface therebetween, one of said regions being thermally non-invertible in conductivity type wherein said one region has the same conductivity type regardless of temperature, the other region being thermally invertible in conductivity type at a predetermined temperature, said thermally invertible region being doped with both P-type and N-type selected impurities in appropriate concentrations to produce conductivity type inversion at said predetermined temperature, said N-type impurities having an activation energy of less than about 0.1 electron volt and having a given actual concentration, said P-type impurities having an activation energy at least three times the activation energy of said N-type impurities and an actual concentration at least ten times said given concentration of said N-type impurities, said thermally invertible region having N-type conductivity below said predetermined temperature and P-type conductivity above said predetermined temperature thereby producing a P-N junction at said interface when both of said regions are of opposite conductivity type and not producing a P-N junction when both of said regions are of the same conductivity type, an electrically conductive terminal on each of said outer regions, said terminals being serially connected into a circuit having a direct current voltage source of appropriate polarity and a temperature indicating means, wherein said body blocks current from the voltage source when said P-N junctions are present, yet readily passes current when they are not present and thereby activates said temperature indicating means.

2. An electrical circuit having a solid state temperature responsive switch device which changes between a nonconducting and a conducting mode at a predetermined temperature due to the appearance and disappearance of a thermally dependent P-N junction, said circuit comprising:
   a body of semiconductive material, said body having two outer regions separated by an inner region thereby defining two interfaces therebetween, said outer regions being thermally non-invertible in conductivity type and thereby having one conductivity type regardless of temperature, said inner region being thermally invertible in conductivity type at a predetermined temperature, said inner region being doped with both P-type and N-type selected impurities in appropriate concentrations to produce conductivity type inversion at said predetermined temperature, said N-type impurities having an activation energy of less than about 0.1 electron volt and having a given actual concentration, said P-type impurities having an activation energy at least three times the activation energy of said N-type impurities and an actual concentration at least ten times said given concentration of said N-type impurities, a terminal on each of said outer regions providing electrical connection to a voltage source, said thermally invertible inner region having N-type conductivity below said predetermined temperature and P-type conductivity above said predetermined temperature thereby producing a P-N junction at said interfaces when said inner region has a conductivity type opposite to that of said outer regions, yet not producing a P-N junction when said inner and outer regions have the same conductivity type, said terminals being serially connected into a circuit having a voltage source and a temperature indicating means, wherein said body blocks current from the voltage source when said P-N junctions are present, yet readily passes current when they are not and thereby activates said temperature indicating means.

3. An electrical circuit having a solid state temperature responsive switch device which changes between a nonconducting and a conducting mode at a predetermined temperature due to the appearance and disappearance of a thermally dependent P-N junction, said circuit comprising:

a body of silicon, said body having two outer regions separated by an inner region thereby defining two interfaces therebetween, said outer regions being thermally non-invertible in conductivity type and thereby having one conductivity type regardless of temperature, said inner region being thermally invertible in conductivity type at a predetermined temperature, said inner region being doped with both P-type and N-type selected impurities in appropriate concentrations to produce conductivity type inversion at said predetermined temperature, said N-type impurities being selected from the group consisting of phosphorus and arsenic, said N-type impurities having an actual concentration of about $10^{15}$ to $10^{19}$ atoms per cubic centimeter of silicon, said P-type impurities being selected from the group consisting of indium and copper, said P-type impurities having an actual concentration at least ten times the concentration of said N-type impurities, a terminal on each of said outer regions for electrical connection to a voltage source, said thermally invertible inner region having N-type conductivity below said predetermined temperature and P-type conductivity above said predetermined temperature thereby producing a P-N junction at said interfaces when said inner region has a conductivity type opposite to that of said outer regions, yet not producing a P-N junction when said inner and outer regions have the same conductivity type, said terminals being serially connected into a circuit having a voltage source and a temperature indicating means, wherein said body blocks current from the voltage source when said P-N junctions are present, yet readily passes current when they are not and thereby activates said temperature indicating means.

4. An electrical circuit having a solid state temperature responsive switch device which changes from a nonconducting to conducting mode at a predetermined temperature due to thermally dependent P-N junction rectification, said circuit comprising:

a body of silicon, said body having two outer regions separated by an inner region thereby defining two interfaces therebetween, said two outer regions being thermally non-invertible in conductivity type and having a P-type conductivity regardless of temperature, said outer regions having a doping concentration of at least $10^{15}$ per cubic centimeter, said inner region being thermally invertible in conductivity type, said inner region being doped with both P-type and N-type impurities, said N-type impurities being selected from a group of phosphorus and arsenic, said N-type impurities having an actual concentration of about $10^{15}$ to $10^{19}$ atoms per cubic centimeter of silicon, said P-type impurities in said inner region being selected from a group consisting of indium and copper, said P-type impurities having an actual concentration about ten times that of said N-type impurities, said thermally invertible inner region having N-type conductivity below a predetermined temperature and P-type conductivity above said predetermined temperature, an electrically conductive terminal on each of said outer regions, said terminals being serially connected into a circuit having a voltage source and a warning means, wherein said body blocks current from the voltage source with a reverse biased P-N junction at one of said interfaces below said predetermined temperature, yet readily passes current above said predetermined temperature due to the disappearance of said P-N junction thereby activating said warning means.

* * * * *